(12) United States Patent
Oh et al.

(10) Patent No.: US 11,659,761 B2
(45) Date of Patent: May 23, 2023

(54) DISPLAY PANEL AND DISPLAY DEVICE INCLUDING MULTI-POLYMER LAYER SUBSTRATE

(71) Applicant: LG Display Co., Ltd., Seoul (KR)

(72) Inventors: Jae-Young Oh, Goyang-si (KR);
Sung-Ki Kim, Goyang-si (KR);
Chang-Hyun Song, Goyang-si (KR);
Hyo-Jae Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 243 days.

(21) Appl. No.: 17/118,541

(22) Filed: Dec. 10, 2020

(65) Prior Publication Data
US 2021/0202878 A1 Jul. 1, 2021

(30) Foreign Application Priority Data
Dec. 31, 2019 (KR) .......................... 10-2019-0180189

(51) Int. Cl.
| | | |
|---|---|---|
| *H01L 51/00* | (2006.01) | |
| *H01L 51/52* | (2006.01) | |
| *H01L 27/32* | (2006.01) | |
| *H01L 29/78* | (2006.01) | |
| *G02F 1/13* | (2006.01) | |
| *H04M 1/02* | (2006.01) | |
| *H04N 5/225* | (2006.01) | |

(Continued)

(52) U.S. Cl.
CPC ............ *H10K 77/10* (2023.02); *H04N 5/2257* (2013.01); *H10K 77/111* (2023.02); *G02F 1/133528* (2013.01); *H01L 29/7869* (2013.01); *H01L 29/78693* (2013.01); *H10K 50/844* (2023.02); *H10K 50/868* (2023.02); *H10K 2102/00* (2023.02)

(58) Field of Classification Search
CPC ............ H01L 51/0096; H01L 51/0097; H01L 51/5253; H01L 51/5293; H01L 2251/301; H01L 27/3234; H01L 27/3244; H01L 27/3272; H01L 29/7869; H01L 29/78693; G02F 1/133528; H04M 1/0264; H04M 1/0268; H04N 5/2254; H04N 5/2257; H10K 50/844; H10K 50/868; H10K 50/80; H10K 59/12; H10K 59/65; H10K 59/00; H10K 59/126; H10K 77/10; H10K 77/111; H10K 2102/00
See application file for complete search history.

(56) References Cited

U.S. PATENT DOCUMENTS 10,191,577 B2 * 1/2019 Choi ...................... G06F 1/1637
10,454,067 B2 10/2019 Seo et al.
11,183,521 B2 * 11/2021 Lee ...................... H01L 27/0296
(Continued)

FOREIGN PATENT DOCUMENTS

KR 10-2019-0056473 A 5/2019

*Primary Examiner* — Ida M Soward
(74) *Attorney, Agent, or Firm* — Fenwick & West LLP

(57) ABSTRACT

A display panel comprises a substrate including a plurality of polymer layers, an inorganic interlayer insulating film, and a semiconductor layer between the plurality of polymer layers and a panel array over the substrate. The semiconductor layer within a substrate may ground electric charges entered from the outside through the semiconductor layer. Thus, the display panel protects an array provided on the substrate and improves the reliability of the display device.

22 Claims, 5 Drawing Sheets

(51) Int. Cl.
*G02F 1/1335* (2006.01)
*H01L 29/786* (2006.01)

(56) References Cited

U.S. PATENT DOCUMENTS

| | | | | |
|---|---|---|---|---|
| 11,289,687 | B2* | 3/2022 | Zhou | ............ H01L 51/0097 |
| 2013/0148057 | A1* | 6/2013 | Kang | ............... C09K 11/70 |
| | | | | 362/606 |
| 2017/0187934 | A1* | 6/2017 | Kwak | ............. G02F 1/1333 |
| 2018/0190944 | A1* | 7/2018 | Lee | ................ H10K 50/816 |
| 2019/0148672 | A1 | 5/2019 | Seo et al. | |
| 2019/0189732 | A1* | 6/2019 | Rieutort-Louis | .. H10K 59/1213 |
| 2019/0310724 | A1* | 10/2019 | Yeke Yazdandoost | ...................... |
| | | | | H10K 59/352 |
| 2020/0035950 | A1 | 1/2020 | Seo et al. | |
| 2020/0161582 | A1* | 5/2020 | Choi | ............... H01L 51/5253 |
| 2020/0176709 | A1* | 6/2020 | Moon | ............... G06F 3/0412 |
| 2021/0083227 | A1* | 3/2021 | Her | ................. H04M 1/026 |

* cited by examiner

DISPLAY PANEL AND DISPLAY DEVICE INCLUDING MULTI-POLYMER LAYER SUBSTRATE

This application claims the benefit of Korean Patent Application No. 10-2019-0180189, filed on Dec. 31, 2019, which is hereby incorporated by reference as if fully set forth herein.

BACKGROUND OF THE INVENTION

Field of the Invention

The present invention relates to a display device, and more particularly, to a display panel, which improves the reliability of a device by applying a protective structure to a substrate, and a display device using the same.

Discussion of the Related Art

As society has recently entered the information age, the field of displays for visually displaying electrical information signals has rapidly developed and, in order to satisfy such development, various flat display devices having excellent performance, such as slimness, light weight and low power consumption, have been developed and have rapidly replaced conventional cathode ray tubes (CRTs).

As examples of such display devices, there are a liquid crystal display (LCD) device, a plasma display panel (PDP) device, a field emission display (FED) device, an organic light emitting diode (OLED) display device, a quantum dot display device, etc. Thereamong, a self-luminous display device, such as an organic light emitting diode (OLED) display device or a quantum dot display device, which does not require a separate light source and achieves compactness and clear color display, is considered as a competitive application.

Further, demand for flexible display devices which are freely deformable is increased now, and research on flexible display devices is underway.

However, flexible display devices must have sufficiently thin substrates in order to achieve flexibility of the devices, and are therefore vulnerable to high-temperature and high-humidity environments.

SUMMARY OF THE INVENTION

Accordingly, the present invention is directed to a display panel and a display device using the same that substantially obviate one or more problems due to limitations and disadvantages of the related art.

An object of the present invention is to provide a display panel which improves the reliability of a device by applying a protective structure to a substrate, and a display device using the same.

That is, the display panel and the display device using the same according to the present invention ground electric charges from the outside so as to protect a panel array on the substrate by preparing a semiconductor layer within a substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display panel includes a substrate including a plurality of polymer layers, an inorganic interlayer insulating film provided between the polymer layers, a semiconductor layer configured to contact the inorganic interlayer insulating film, and a panel array provided on the substrate.

In another aspect of the present invention, a display device includes a substrate including a first polymer layer, a second polymer layer, and a semiconductor layer and an inorganic interlayer insulating film provided between the first and second polymer layers, a panel array provided on the second polymer layer, and a camera provided under the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
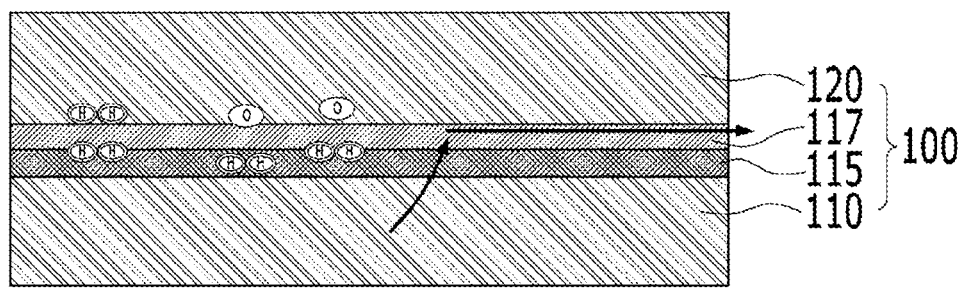
FIG. 1 is a cross-sectional view illustrating a substrate according to a first embodiment of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it may make the subject matter of the present invention rather unclear. Further, the names of elements used in the following description of the embodiments of the present invention are selected in consideration of ease of preparation of the specification, and may thus differ from the names of parts of an actual product.

The shapes, sizes, ratios, angles and numbers of elements given in the drawings to describe the embodiments of the present invention are merely exemplary, and thus, the present disclosure is not limited to the illustrated details. In the following description of the embodiments, the terms "including", "comprising" and "having" are to be interpreted as indicating the presence of one or more characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is "on", "above", "under" or "beside" another element, the two elements may directly contact each other, or one or more other elements may be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention may be partially or wholly coupled to or combined with each other and be interlocked or driven in various technical manners, and the respective embodiments may be implemented independently of each other or be implemented together through connection therebetween.

FIG. 1 is a cross-sectional view illustrating a substrate according to a first embodiment of the present invention.

As shown in FIG. 1, a substrate 100 according to the first embodiment of the present invention includes a first polymer layer 110, a second polymer layer 120, and an inorganic interlayer insulating film 115 and a semiconductor layer 117 provided between the first polymer layer 110 and the second polymer layer 120.

Here, the semiconductor layer 117 functions to ground hydrogen ions and oxygen ions generated from the first and second polymer layers 110 and 120 and then to discharge the grounded hydrogen ions and oxygen ions to the outside of the substrate 100.

In a display device, a substrate including a polymer layer may have a small thickness, but moisture introduced from the outside may be ionized in high-temperature and high-humidity environments and thus influence a panel array formed on the upper surface of the substrate.

In a display panel according to the present invention, the substrate 100 includes a plurality of polymer layers 110 and 120 and the semiconductor layer 170 provided therebetween, and may thus ground conductive ions generated within the substrate 100 and then discharge the grounded ions to the outside of the substrate 100.

The semiconductor layer 117 may be an amorphous silicon layer or a polysilicon layer and, as circumstances require, may include n-type or p-type ionic impurities in order to strengthen the ground function.

For example, in the case of a display panel vulnerable to positive ionic impurities, such as hydrogen ions, the substrate 100 is neutralized by doping the semiconductor layer 117 provided in the substrate 100 with n-type impurities having high electron mobility, for example, $PH_3$, thereby preventing the positive impurities, such as hydrogen ions, from influencing a panel array formed on the substrate 100.

Otherwise, in the case of a display panel vulnerable to negative ionic impurities, such as oxygen ions, the negative ionic impurities are grounded in the substrate 100 by doping the semiconductor layer 117 provided in the substrate 100 with p-type impurities having high hole mobility, thereby preventing the negative impurities from influencing the panel array formed on the substrate 100.

In addition to the amorphous silicon layer or the polysilicon layer, the semiconductor layer 117 may be formed of any material capable of being referred to as a semiconductor layer, i.e., an oxide semiconductor layer or a metal-induced semiconductor layer. The semiconductor layer 117 has conductivity of a designated level or more within the substrate 100 unlike other insulating layers, i.e., the first and second polymer layers 110 and 120 and the inorganic interlayer insulating film 115, and thus serves as a path to which oxygen ions, hydrogen ions and the like move and from which they are then discharged.

When the semiconductor layer 117 is provided in the substrate 100, a mask may be omitted, compared to the case in which a ground metal pattern is provided on the panel array so as to collect conductive foreign substances, and thereby, the semiconductor layer 117 may improve yield in addition to removal of conductive foreign substances or conductive ions using the unique function thereof.

The first and second polymer layers 110 and 120 included in the substrate 100 determine the total thickness of the substrate 100, which total thickness is several μm to tens of μm and, when the display panel is implemented by forming the panel array on the substrate 100, the display panel may have flexibility. In order to further improve slimness and flexibility thereof, each of the first and second polymer layers 110 and 120 may be formed to have a thickness of 10 μm or less.

Each of the first and second polymer layers 110 and 120 is a transparent polymer layer or a colored polymer layer having a designated transmittance or more, and may include at least one polymer compound selected from the group consisting of polyester and copolymers including polyester, polyimide and copolymers including polyimide, olefin-based copolymers, polyacrylic acid and copolymers including polyacrylic acid, polystyrene and copolymers including polystyrene, polysulfate and copolymers including polysulfate, polycarbonate and copolymers including polycarbonate, polyamic acid and copolymers including polyamic acid, polyamine and copolymers including polyamine, polyvinyl alcohol, and polyallylamine.

Further, the inorganic interlayer insulating film 115 is formed of a material having high moisture resistance, and, for example, may be a silicon-based inorganic layer formed of $SiO_x$, $SiO_xN_y$, or $SiN_x$. Considering that the first and second polymer layers 110 and 120 formed of only organic components have relatively low moisture resistance compared to inorganic materials, the inorganic interlayer insulating film 115 is provided between the first and second polymer layers 110 and 120 in order to improve moisture resistance of the substrate 100. The inorganic interlayer insulating film 115 may function as a barrier which prevents moisture flowing into the first and second polymer layers 110 and 120 from flowing to the panel array.

The substrate 100 is not limited to the above-described two polymer layers 110 and 120, and may include a larger number of polymer layers, as needed. When the substrate 100 includes three or more polymer layers, the inorganic interlayer insulating film 115 and the semiconductor layer 117 contacting each other may be provided between the respective polymer layers, or be provided between some of the polymer layers. When the inorganic interlayer insulating film 115 and the semiconductor layer 117 are provided between the respective polymer layers, introduction of moisture or ionic impurities into the panel array may be more effectively prevented.

In this case, the semiconductor layer 117 may contact the upper surface or the lower surface of the inorganic interlayer insulating film 115.

Figure 2:
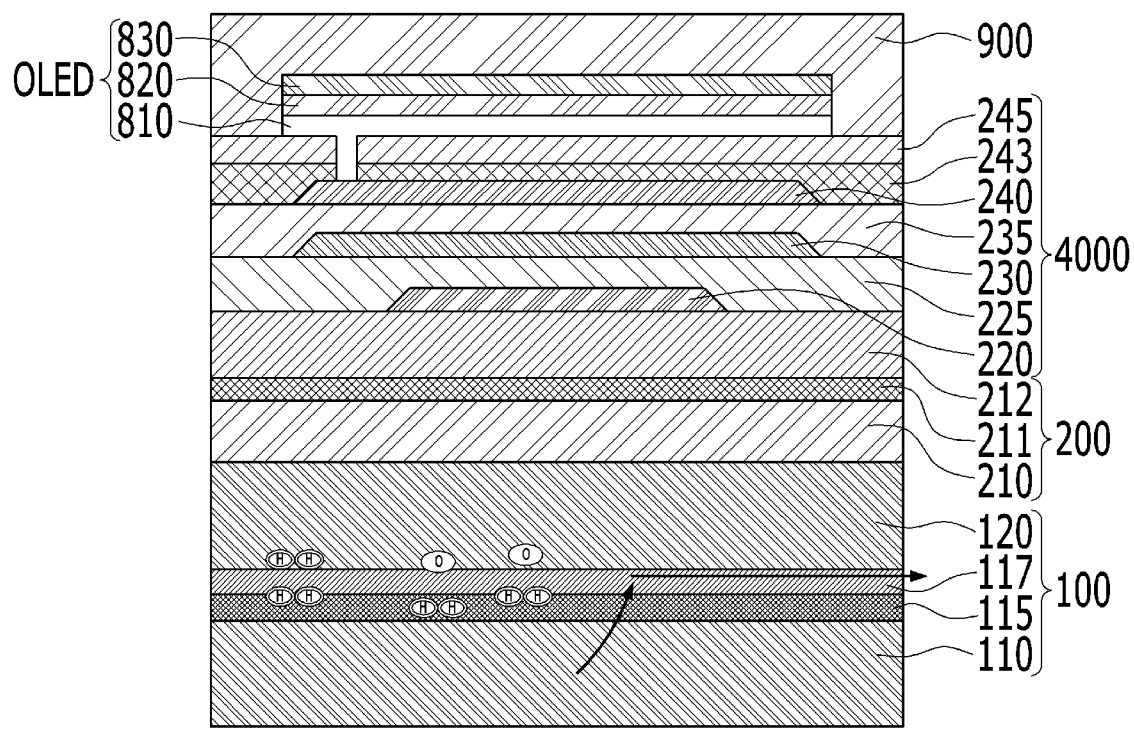
FIG. 2 is a cross-sectional view illustrating a display panel according to the first embodiment of the present invention.

FIG. 2 is a cross-sectional view illustrating a display panel according to the first embodiment of the present invention.

FIG. 2 illustrate an example of a display panel 500 including the substrate 100 of FIG. 1, and a buffer stack 200 and a panel array 4000 are formed on the substrate 100.

The buffer stack 200 may include a first inorganic buffer 210, a second inorganic buffer 211 and an active buffer layer 212. As circumstances require, any one of the first inorganic buffer 210, the second inorganic buffer 211 and the active buffer layer 212 may be omitted.

Here, the reason why the first and second inorganic buffers 210 and 211 are separately provided is that inorganic films formed of different materials prevent permeation of moisture from the outside and reduce influence of impurities from outdoor air. The first inorganic buffer 210 may be a silicon oxide film, and the second inorganic buffer 211 may be a silicon nitride film. As needed, the first and second inorganic buffers 210 and 211 may be reversed, and the buffer stack 200 may further include a multilayer structure including inorganic insulating films. The first and second inorganic buffers 210 and 211 may prevent transfer of impurities from the lower substrate 100 to the panel array 4000 located thereon and permeation of moisture from the outside.

The active buffer layer 212 serves to prevent impurities from the lower portion of the substrate 100 from entering a semiconductor layer 220, which will be subsequently formed thereon, and to stabilize the semiconductor layer 220.

The panel array 4000 may be provided on the active buffer layer 220, as shown in FIG. 2, and include, for example, the semiconductor layer 220, a gate insulating film 225, a first wiring layer 230, a first interlayer insulating film 235, a second wiring layer 240, a second interlayer insulating film 243 and a third interlayer insulating film 245, which are sequentially formed.

The semiconductor layer 220 and the first and second wiring layers 230 and 240 may form a thin film transistor TFT, the thin film transistor TFT may be connected to an organic light emitting diode OLED formed thereon, and the organic light emitting diode OLED may be protected by an encapsulation layer 900 formed thereon. The organic light emitting diode OLED may include a first electrode 810, at least one light emitting layer 820 and a second electrode 830, and the first electrode 810 may be connected to one electrode of the thin film transistor TFT.

The shown example of the panel array 4000 is illustrated from the viewpoint of a thin film transistor array, and the panel array 4000 of a display device may include light emitting elements on the third interlayer insulating film 245. The light emitting element may include a first electrode and a second electrode facing each other and a light emitting layer provided between the first and second electrodes. The light emitting layer may include an organic material or an inorganic material.

Further, an encapsulation layer (not shown) may be formed so as to sufficiently cover and overlay the light emitting elements, where the light emitting elements are formed. The area of the encapsulation layer may be the same as or greater than that of the panel array 4000.

The panel array 4000 may be provided within an active area AA including a plurality of pixels on a first surface of the substrate 100.

The semiconductor layer 117 of the substrate 100 according to the present invention may have various forms in addition to the above-described configuration shown in FIG. 1, and the substrate 100 may be implemented according to various embodiments, which will be described below, and be included in a display panel or a display device.

Hereinafter, substrates having various forms according to other embodiments will be described.

Figure 3:
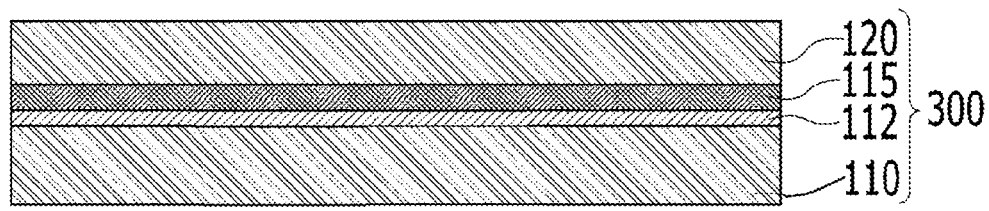
FIG. 3 is a cross-sectional view illustrating a substrate according to a second embodiment of the present invention.

FIG. 3 is a cross-sectional view illustrating a substrate according to a second embodiment of the present invention.

As shown in FIG. 3, a substrate 300 according to the second embodiment of the present invention is configured such that a semiconductor layer 112 is provided close to a first polymer layer 110 located at the lower portion of the substrate 300.

Thereby, the substrate 300 according to the second embodiment of the present invention includes the first polymer layer 110, the semiconductor layer 112, an inorganic interlayer insulating film 115 and a second polymer layer 120, which are sequentially stacked.

The semiconductor layer 112 may have a function of grounding oxygen ions and hydrogen ions, in the same manner as in the above-described first embodiment.

Figure 4:
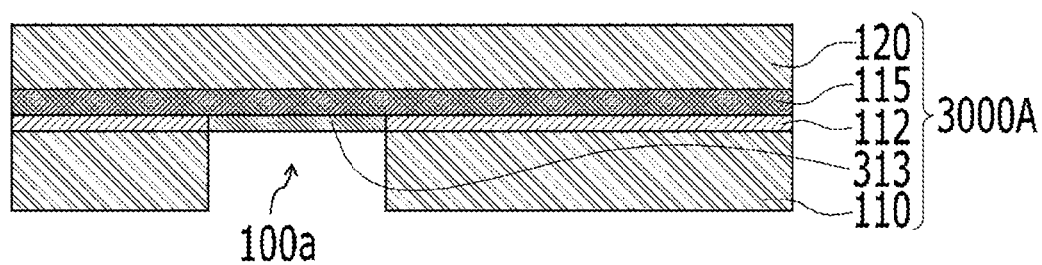
FIG. 4 is a cross-sectional view illustrating a substrate according to a third embodiment of the present invention.

FIG. 4 is a cross-sectional view illustrating a substrate according to a third embodiment of the present invention.

As shown in FIG. 4, a substrate 3000A according to the third embodiment of the present invention has the same layered structure as the substrate 300 shown in FIG. 3, but is provided with a first hole 100a in a designated region. Here, the first hole 100a may be formed only through a first polymer layer 110.

For example, when a camera is located under the substrate 3000A, the first hole 100a is formed by removing the first polymer layer 110, i.e., one of the layers of the substrate, and thereby, an amount of light absorbed by the first polymer layer 110 may be offset and thus the recognition ability of the camera may be improved.

The first polymer layer 110 may be removed to form a designated hole shape, for example, by radiating a laser from below. In this case, a portion of a semiconductor layer 313 remaining in a region on which the laser is radiated is modified by the laser, and thus has crystallinity different from that of a semiconductor layer 112 around the first hole 100a.

In this case, the semiconductor layer 313 over the first hole 100a may include polysilicon, and the semiconductor layer 112 around the first hole 100a may include amorphous silicon. This is only one example, the semiconductor layer 313 over the first hole 100a and the semiconductor layer 112 around the first hole 100a may have different grain sizes or different crystallinities by varying an energy intensity of laser radiation.

The modified semiconductor layer 313 over the first hole 110a may function to protect an inorganic interlayer insulating film 115 located thereon.

In this case, the semiconductor layer 313 over the first hole 100a has transparency, and thus does not deteriorate the recognition ability of the camera when the camera is located in the first hole 100a.

Further, the semiconductor layer 313 over the first hole 100a and the semiconductor layer 112 around the first hole 100a are formed through the same process, among processes for forming respective layers of the substrate 3000A, but are imparted with different crystallinities by radiating the laser as a post-process for forming the first hole 100a. Therefore, the semiconductor layers 313 and 112 are formed in the same layer without a step (i.e., a height difference).

Figure 5:
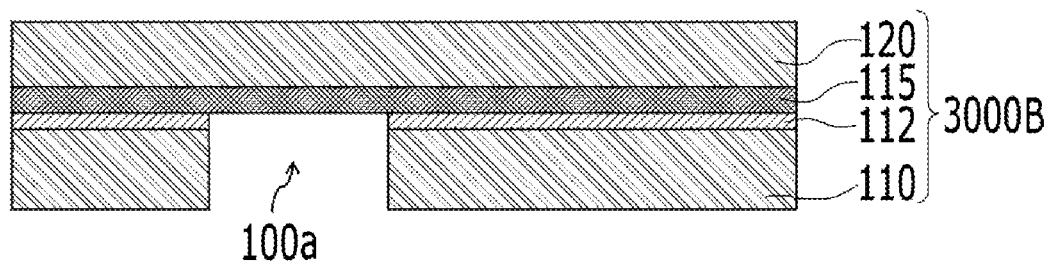
FIG. 5 is a cross-sectional view illustrating a substrate according to a fourth embodiment of the present invention.

FIG. 5 is a cross-sectional view illustrating a substrate according to a fourth embodiment of the present invention.

As shown in FIG. 5, in a substrate 3000B according to the fourth embodiment of the present invention, a first hole 100a may be formed by radiating a laser. Here, by increasing the intensity of the laser, a first polymer layer 110 and a semiconductor layer 112 are completely removed from an area corresponding to the first hole 100a, and thus, the semiconductor layer 112 may remain only around the first hole 100a.

In this case, an inorganic interlayer insulating film 115 may be exposed through the first hole 100a. Therefore, since the first polymer layer 110 and the semiconductor layer 112 are not provided above a camera (i.e., in the first hole 100a), improvement in the recognition ability of the camera may be expected.

Figure 6:
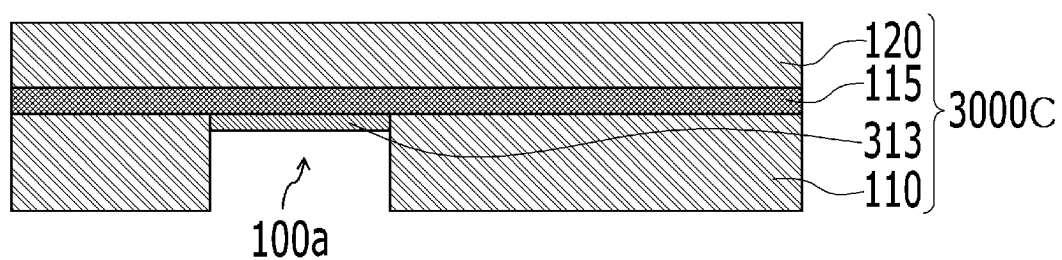
FIG. 6 is a cross-sectional view illustrating a substrate according to a fifth embodiment of the present invention.

FIG. 6 is a cross-sectional view illustrating a substrate according to a fifth embodiment of the present invention.

As shown in FIG. 6, in a substrate 3000C according to the fifth embodiment of the present invention, a semiconductor layer 313 remains only in a first hole 100a. In this case, the semiconductor layer 313 is exposed directly to the outside, and may thus reinforce a function of collecting conductive ions and improve the recognition ability of a camera when the camera is located under the first hole 100a.

Figure 7:
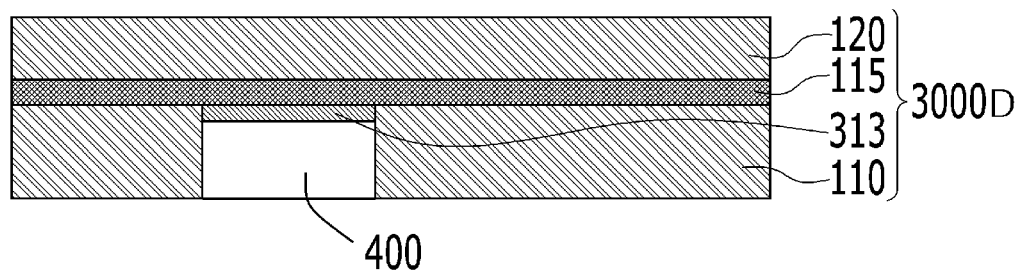
FIG. 7 is a cross-sectional view illustrating a substrate according to a sixth embodiment of the present invention.

FIG. 7 is a cross-sectional view illustrating a substrate according to a sixth embodiment of the present invention.

As shown in FIG. 7, in a substrate 3000D according to the sixth embodiment of the present invention, the inside of a first hole 100a formed by removing a first polymer layer 110 is filled with a transparent organic resin 400 which is resistant to moisture and has higher transmittance than that of the first polymer layer 110, thereby being capable of preventing formation of a step (i.e., a height difference) with the first polymer layer 110.

This serves to prevent foreign substances, such as dust, from being introduced into the substrate 3000D through the first hole after the formation of the first hole, corresponding to a camera.

The above-described substrates 100, 300, 3000A, 3000B, 3000C and 3000D according to the first to sixth embodiments may include a camera and be applicable to a display device, as described below.

Hereinafter, the display device will be described in more detail.

Figure 8:
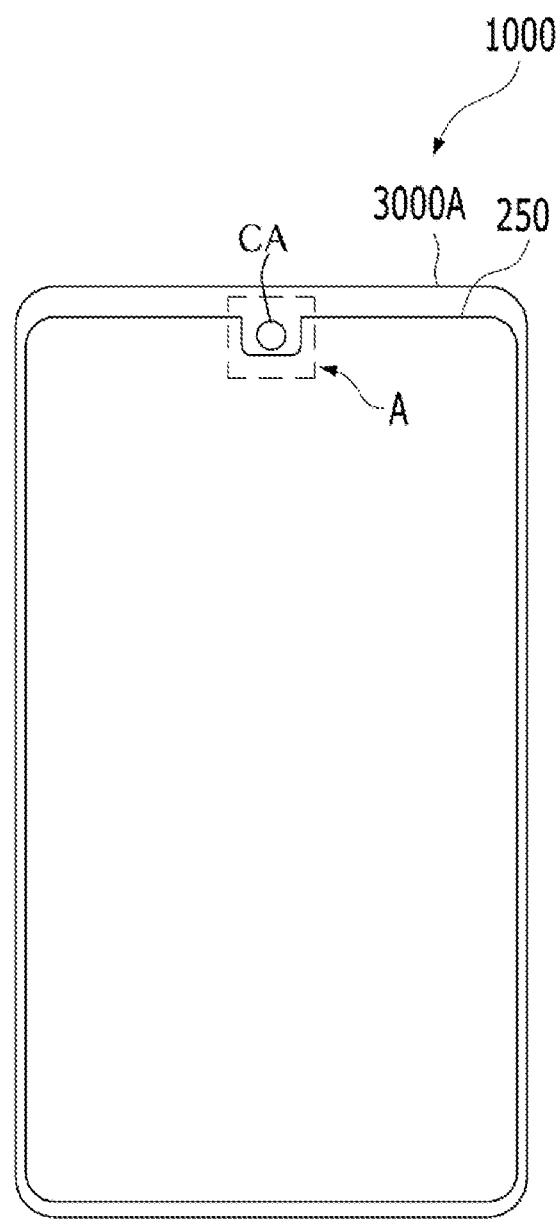
FIG. 8 is a plan view illustrating a display device according to the present invention.
Figure 9:
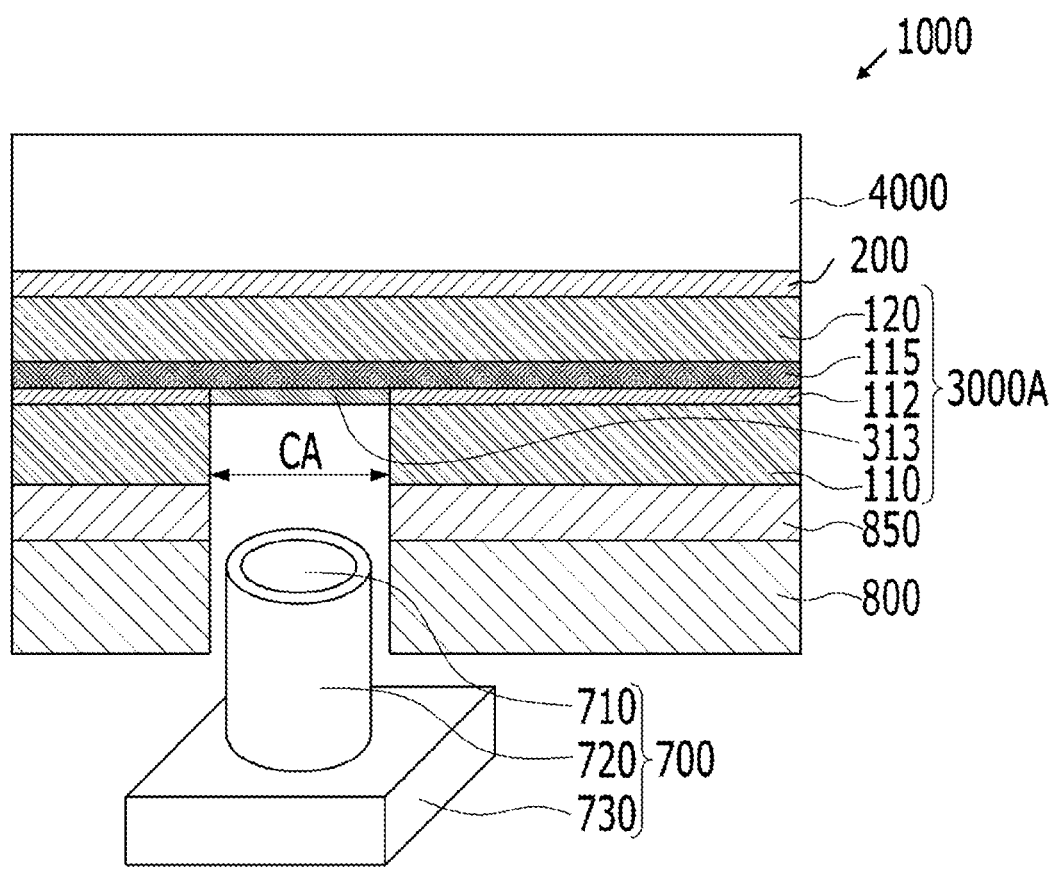
FIG. 9 is a cross-sectional view of portion A of FIG. 8.

FIG. 8 is a plan view illustrating a display device according to the present invention, and FIG. 9 is a cross-sectional view of portion A of FIG. 8.

As shown in FIGS. 8 and 9, a display device 1000 may include a camera area CA in a designated region of the substrate 3000A, and a camera 700 may be provided in this camera area CA under the substrate 3000A.

The camera 700 includes, as shown in FIG. 9, a camera lens 710, a camera module 720 which supports the camera lens 710, and a camera circuit board 730, to which the camera lens 710 is connected and which applies an electrical signal.

The camera area CA may be observed as a hole formed in the substrate 3000A (100a shown in FIGS. 4 to 6), and the camera lens 710 may be inserted into the camera area CA. As circumstances require, the camera module 720 may be inserted into the camera area CA or be located in the periphery of the camera area CA.

The camera circuit board 730 may be connected to the camera lens 710 at right angles, extend to the periphery of the camera area CA, and be mounted on the rear surface of the substrate 3000A.

A back plate 800 may be adhered to the lower surface of the first polymer layer 110 located as the lowermost layer of the substrate 3000A by an adhesive layer 850. In this case, the camera circuit board 730 may contact the rear surface of the back plate 800.

Further, a buffer stack 200 and a panel array 4000 may be located on the upper surface of the substrate 3000A, and a polarizing plate 250 may be provided on the upper surface of the panel array 4000 so as to prevent reflection of external light.

A portion of the polarizing plate 250 corresponding to the camera area CA may be removed, thereby improving the recognition ability of the camera 700.

As circumstances require, a portion of the polarizing plate 250, which is spaced apart from the camera area CA, may be removed, and thereby, loss of the quantity of light incident upon the camera lens 710 due to use of the polarizing plate 250 including a dichroic dye, which is formed of a light absorbing material, may be prevented, and thus the recognition ability of the camera 700 may be improved.

By applying the substrate provided with the first hole 100a corresponding to the camera area CA, as described in each of the third to sixth embodiments, to the display device 1000 and installing the camera 700 corresponding to the first hole 100a, the display device 1000 may obtain the above-described effects of the substrate.

A display panel described in the present invention has a configuration including a substrate, and a panel array and an encapsulation layer on the substrate without any housing structure. Further, a display device described in the present invention may conceptually have a broader meaning than a display panel, and include a unit for protecting the display panel, a camera and a unit for protecting the camera. FIG. 2 illustrates the display panel, and FIGS. 8 and 9 illustrate the display device. The display panel shown in FIG. 2 may be implemented using the substrates 300 and 3000A to 3000D according to the second to sixth embodiments in addition to the substrate 100 according to the first embodiment shown in FIG. 1, and the display device shown in FIGS. 8 and 9 may be implemented using the substrates 3000A to 3000D according to the third to sixth embodiments.

The display panel according to the present invention grounds electric charges entering the polymer substrate through the semiconductor layer provided between the polymer layers, and may thus minimize electrical influence on the panel array provided on the polymer substrate and improve the reliability of the elements.

Further, the conductive ions may be removed by forming the semiconductor layer without a separate mask, and thus, the yield of the display device may be improved.

In addition, in the structure in which a part of the thickness of the substrate is removed from a designated area, the semiconductor layer may protect the inorganic interlayer insulating film provided in the substrate, thus being capable of effectively preventing moisture permeation.

Moreover, the display panel of the present invention having a structure, in which a part of the thickness of the substrate is removed from a designated area and a camera is provided so as to correspond to the designated area, may improve transmittance when the semiconductor layer is removed from the designated area, and improve the recognition ability of the camera.

Here, the position of the semiconductor layer and the shape of the hole formed in the designated area of the substrate may be adjusted according to various forms of display devices.

To accomplish this, a display panel according to one embodiment of the present invention may include a substrate including a plurality of polymer layers, an inorganic interlayer insulating film provided between the polymer layers, a semiconductor layer configured to contact the inorganic interlayer insulating film, and a panel array provided on the substrate.

The semiconductor layer may be formed of amorphous silicon or polysilicon.

The semiconductor layer may be doped with n-type or p-type conductive impurities.

A first area of the substrate may be removed from one surface of the substrate configured not to contact the panel array, before touching a surface of the inorganic interlayer insulating film.

The semiconductor layer may be provided in an area configured to surround the first area of the substrate.

The semiconductor layer located in the first area of the substrate and the semiconductor layer located around the first area of the substrate may have different crystallinities.

The semiconductor layer may be provided only in the first area of the substrate.

A camera may be provided under the first area of the substrate.

The polymer layers may include a first polymer layer and a second polymer layer, the semiconductor layer and the inorganic interlayer insulating film may be sequentially provided between the first and second polymer layers, and the semiconductor layer may be provided closer to the camera.

A display device according to one embodiment of the present invention may include a substrate including a first polymer layer, a second polymer layer, and a semiconductor layer and an inorganic interlayer insulating film provided between the first and second polymer layers, a panel array provided on the second polymer layer, and a camera provided under the substrate.

A back plate may be adhered to a lower surface of the first polymer layer.

The camera may include a camera lens, a camera module and a camera circuit board, and the camera circuit board may extend from lower portions of the camera lens and the camera module to a lower surface of the back plate.

The camera lens may be inserted into the first polymer layer.

The semiconductor layer may be spaced apart from the camera lens and be provided in an area of the substrate configured to surround the camera lens.

The semiconductor layer located in an area of the substrate corresponding to the camera lens and the semiconductor layer located around the camera lens may have different crystallinities.

The semiconductor layer may be formed of amorphous silicon or polysilicon.

The semiconductor layer may be doped with n-type or p-type conductive impurities.

As is apparent from the above description, a display panel and a display device using the same according to the present invention have the following effects.

First, a semiconductor layer provided between polymer layers grounds electric charges entering a polymer substrate, and may thus minimize electrical influence on a panel array provided on the polymer substrate and improve the reliability of elements.

Second, the conductive ions may be removed by forming the semiconductor layer without a separate mask, and thus, the yield of the display device may be improved.

Third, in a structure in which a part of the thickness of the substrate is removed from a designated area, the semiconductor layer may protect an inorganic interlayer insulating film provided in the substrate, thus effectively preventing moisture permeation.

Fourth, the display panel of the present invention having a structure, in which a part of the thickness of the substrate is removed from a designated area and a camera is provided so as to correspond to the designated area, may improve transmittance when the semiconductor layer is removed from the designated area, and improve the recognition ability of the camera.

Fifth, the position of the semiconductor layer and the shape of a hole formed in the substrate may be adjusted according to various forms of display devices.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display panel comprising:
   a substrate comprising a plurality of polymer layers;
   an inorganic interlayer insulating film and a semiconductor layer between the plurality of polymer layers; and
   a panel array over the substrate,
   wherein a first area of the substrate is removed from one surface of the substrate configured not to contact the panel array, before a surface of the inorganic interlayer insulating film.

2. The display panel according to claim 1, wherein the semiconductor layer is formed of amorphous silicon or polysilicon.

3. The display panel according to claim 1, wherein the semiconductor layer is doped with n-type or p-type conductive impurities.

4. The display panel according to claim 1, wherein the semiconductor layer contacts an upper surface or a lower surface of the inorganic interlayer insulating film.

5. The display panel according to claim 1, wherein:
   the panel array comprises thin film transistors, light emitting elements connected to the thin film transistor, and an encapsulation layer configured to protect the light emitting elements.

6. The display panel according to claim 1, wherein the semiconductor layer is provided in an area configured to surround the first area of the substrate.

7. The display panel according to claim 1, wherein the semiconductor layer includes a first semiconductor layer located in the first area of the substrate and a second semiconductor layer located around the first area of the substrate, and the first and second semiconductor layers have different crystallinities.

8. The display panel according to claim 1, wherein the semiconductor layer is provided only in the first area of the substrate.

9. The display panel according to claim 1, further comprising a camera under the first area of the substrate.

10. The display panel according to claim 1, wherein an inside of the first area of the substrate is filled with a transparent organic resin.

11. A display device comprising:
- a substrate comprising a first polymer layer, a second polymer layer, and a semiconductor layer and an inorganic interlayer insulating film provided between the first and second polymer layers;
- a panel array over the second polymer layer; and
- a camera under the substrate,
- wherein the first polymer layer is locally removed at a region corresponding to the camera.

12. The display device according to claim 11, further comprising a back plate adhered to a lower surface of the first polymer layer.

13. The display device according to claim 12, wherein the camera comprises a camera lens, a camera module and a camera circuit board,
- wherein the camera circuit board extends from lower portions of the camera lens and the camera module to a lower surface of the back plate.

14. The display device according to claim 13, wherein the camera lens is inserted into the first polymer layer.

15. The display device according to claim 13, wherein the semiconductor layer is spaced apart from the camera lens and is provided in an area of the substrate configured to surround the camera lens.

16. The display device according to claim 13, wherein the semiconductor layer includes a first semiconductor layer located in an area of the substrate corresponding to the camera lens and a second semiconductor layer located around the camera lens, and the first and second semiconductor layers have different crystallinities.

17. The display device according to claim 11, wherein the semiconductor layer is provided only in an area of the substrate corresponding to the camera.

18. The display device according to claim 11, wherein the semiconductor layer is provided closer to the camera than the inorganic interlayer insulating film.

19. The display device according to claim 11, wherein the semiconductor layer is formed of amorphous silicon or polysilicon.

20. The display device according to claim 11, wherein the semiconductor layer is doped with n-type or p-type conductive impurities.

21. A display device comprising:
- a substrate comprising a first polymer layer, a semiconductor layer directly on the first polymer layer, an inorganic interlayer insulating film directly on the semiconductor layer, and a second polymer layer directly on the inorganic interlayer insulating film;
- a panel array over the second polymer layer; and
- a camera under the substrate,
- wherein the semiconductor layer has higher conductivity than the inorganic interlayer insulating film.

22. The display device according to claim 21, wherein the inorganic interlayer insulating film comprises a silicon-based inorganic material.

* * * * *